(12) United States Patent
Christopherson et al.

(10) Patent No.: US 6,710,604 B2
(45) Date of Patent: Mar. 23, 2004

(54) DEVICE AND METHOD FOR DIRECTLY INJECTING A TEST SIGNAL INTO A CABLE

(75) Inventors: Scott Lee Christopherson, Rochester, MN (US); Edward Charles Gillard, Mantorville, MN (US); Don Alan Gilliland, Rochester, MN (US); Kenneth E. Monsen, Dover, MN (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 10/035,201

(22) Filed: Jan. 4, 2002

(65) Prior Publication Data

US 2003/0128037 A1 Jul. 10, 2003

(51) Int. Cl.[7] .......................... H01H 31/02; H04B 3/46; H01R 11/20
(52) U.S. Cl. ........................................ 324/543; 439/426
(58) Field of Search .............................. 324/543, 126, 324/129, 627; 439/426, 387

(56) References Cited

U.S. PATENT DOCUMENTS

| | | | | |
|---|---|---|---|---|
| 3,674,916 A | * | 7/1972 | Langella | 439/411 |
| 3,839,672 A | * | 10/1974 | Anderson | 324/627 |
| 4,080,034 A | * | 3/1978 | Werner | 439/413 |
| 5,101,161 A | * | 3/1992 | Walsh et al. | 324/543 |
| 5,367,251 A | * | 11/1994 | McTigue | 324/133 |
| 5,426,360 A | * | 6/1995 | Maraio et al. | 324/126 |
| 6,065,976 A | * | 5/2000 | Wang | 439/63 |
| 6,177,884 B1 | * | 1/2001 | Hunt et al. | 324/126 |
| 6,179,644 B1 | * | 1/2001 | Adams et al. | 439/387 |
| 6,468,089 B1 | * | 10/2002 | Hubbard et al. | 439/63 |

* cited by examiner

Primary Examiner—N. Le
Assistant Examiner—Timothy J. Dole
(74) Attorney, Agent, or Firm—Rabin & Berdo, P.C.

(57) ABSTRACT

A device for piercing a cable includes a first clamp member and a second clamp member. The first clamp member and the second clamp member are superposed relative to each other. A conductive piercing member is disposed on the first clamp member. The device further includes an arrangement for moving the first clamp member and the second clamp member together. As the first clamp member and the second clamp member are moved together, a distance between the conductive piercing member and the second clamp member is reduced.

24 Claims, 5 Drawing Sheets

DEVICE AND METHOD FOR DIRECTLY INJECTING A TEST SIGNAL INTO A CABLE

BACKGROUND OF THE INVENTION

1. Field of the Invention

The present invention relates to a device and method for directly injecting a test signal into a cable, so that the isolating characteristics of the system immunity response can be evaluated.

2. Background Information

Computer systems typically include a number of electrical components, such as printed circuit boards, that are electrically coupled together. One way to accomplish this is to use electrical cables to electrically join the respective electrical components. For example, the electrical cables allow electrical signals, via signal wires, to be transmitted from one printed circuit board to another printed circuit board, so that various electronic devices on the one printed circuit board can communicate with electronic devices on the other printed circuit board. Cables are also used to supply power to and from the various electrical components.

However, many electrical devices, both inside of the computer system and external to the computer system, when operated, generate emissions that include electromagnetic radiation. This electromagnetic radiation may travel through the air, and be received by the signal wires of the cable. The received electromagnetic radiation may then adversely affect the operation of the electronic devices to which the cable is connected, causing the computer system to malfunction. When this electromagnetic radiation influences the proper functioning of the electronic devices, the result is known as electromagnetic interference (also known as EMI). Thus, in order to ensure reliable operation, the signal wires within the cables must be shielded against outside interference. For example, it is known to wrap or encircle all of the wires in a cable by a conducting shield, usually foil or braided wire, which is connected to an external jacket, such as a metal housing shield of a plug, at each end of the cable. The metal housing shield is then coupled to a ground potential, so that any electromagnetic radiation is conducted to the ground potential, thereby preventing the radiation from adversely affecting the electronic devices coupled to the cable.

Certain regulations have been established which provide a frequency range that a shield must be capable of isolating the cable's signal wires from, to ensure that the conducting shield of the cable provides adequate protection against electromagnetic interference. For example, the International Electrotechnical Commission (IEC) has established and published various standards that stipulate the frequency ranges that the shields must provide isolation for. One published standard (IEC Standard 61000-4-6, entitled *Immunity to Conducted Disturbances Induced by Radio Frequency Fields*) provides that a shield must isolate the internal cable wires from electromagnetic interference radiation in the frequency range between 150 kilohertz to 80 megahertz. Moreover, this standard provides criteria that must be in place when the testing is performed. For example, this standard dictates that in testing a system's immunity response, a test signal (which simulates electromagnetic interference radiation in the noted frequency range) must be directly injected into the shield of the cable, via a 100-Ohm resister, while the cable is disposed 30 mm from the floor, in order to test the system immunity response. If the system is not isolated from the test signal, for example if the shield does not isolate the internal cable wires from the test signal, then the system will be deemed as being unsatisfactory for use in certain environments. For example, all systems marketed in Europe must meet the requirements of the standard.

However, although the above standard provides guidelines for testing the system, the standard is silent on how to actually perform the test. Thus, it is up to the end user of the system, to provide a mechanism and procedure that will allow the system to be tested to ensure that they meet the shielding requirements of this and other various standards.

Moreover, it is known to test a system for susceptibility to electromagnetic radiation interference by injecting the test signal using antennas. However, a test signal injected using an antenna is not directly injected, but instead is remotely injected, and thus would not meet the requirements of a standard that requires a direct injection of a test signal. Thus, there is a need for a device that allows a test signal to be directly injected into a shield of a cable. Moreover, there is a need for a procedure for implementing the direct injecting of a test signal into a shield of a cable.

Further, it is desirable to perform the direct injecting of the test signal into the shield without damaging the cable. That is, typically the shield is covered with an outer insulating sheathing (cover). Obviously, to access the shield for the direct injection, the cover must be penetrated in some manner. However, it would be desirable if this penetration did not damage the cable to an extent that the cable could no longer be used. Thus, there is a need for a device that allows for the direct injecting of a test signal into a shield of a cable, that does not damage the cable.

Furthermore, as previously discussed, the shield surrounds the wires of the cable. However, for the testing to be accurately performed, it is important that the device used for injecting the test signal does not contact the underlying wires. If the device should contact one or more of the wires, then the wires will conduct the test signal, skewing the results of any test. Thus, there is a need for a device that allows for the direct injecting of a test signal into a shield of a cable, while ensuring that the wires within the cable are not contacted by the device.

SUMMARY OF THE INVENTION

It is, therefore, a principal object of this invention to provide a device and method for directly injecting a test signal into a cable.

It is another object of the invention to provide a device and method for directly injecting a test signal into a cable that solves the above-mentioned problems.

These and other objects of the present invention are accomplished by the device and method for directly injecting a test signal into a cable disclosed herein.

According to one aspect of the invention, a device for directly injecting a test signal into a cable is provided. The device includes a lower clamp member, and an upper clamp member superposed over the lower clamp member. Both the lower clamp member and the upper clamp member are preferably formed from an insulating material, such as plastic. Forming these features of an insulating material ensures that these components will not form a conductive path for the injected test signal.

In an exemplary aspect of the invention, the device has a conductive piercing member, such as a metal pin, disposed on the lower clamp member to project toward the upper clamp member. In use, the conductive piercing member will pierce an outer sheathing (which is typically an insulator) of the cable, and engage an inner conductive shield of the cable, in a manner that will be subsequently described. Moreover, the conductive piercing member preferably has a sharp, pointed tip that can easily pierce the outer sheathing of the cable.

The device further has a conductive coupling member disposed on an upper surface of the lower clamp member. The conductive coupling member is electrically coupled to the conductive piercing member.

In the exemplary embodiment, the conductive piercing member is integral to the conductive coupling member. For example, the conductive piercing member can be a pin that is welded or soldered, or otherwise permanently fastened to the conductive coupling member. Alternatively, the conductive piercing member can be stamped from the conductive coupling member. With this arrangement, the conductive piercing member would have an inverted V-shaped configuration to facilitate the stamping of a suitably sharp piercing member.

The device may further include a coaxial connector that is electrically coupled, via a resistor for example, to the conductive coupling member. The coaxial connector facilitates the connection of a signal generator to the device. For example, one end of a standard coaxial cable can be easily connected to the coaxial connector, and another end of the standard coaxial cable can be connected to the signal generator.

The conductive coupling member may have an L-shaped configuration, with a short leg of the L projecting over a side of the lower clamp member. This short leg can then be fastened, for example using a screw, to the resistor.

The lower clamp member may be provided with a recess for accommodating the short leg of the conductive coupling member, the end of the coaxial connector, and the resistor. The recess advantageously allows these features to be somewhat protected by the lower clamp member, and helps to reduce the size of the device.

The upper clamp member may be provided with a groove disposed on a lower surface, and across a width, thereof. The groove is arranged to be essentially parallel to the conductive coupling member and positioned directly thereover. The groove helps to position the cable to be tested in the proper orientation relative to the conductive piercing member and helps to ensure that the cable will not inadvertently shift when the upper clamp member and the lower clamp member are clamped together.

To facilitate the clamping of the upper clamp member to the lower clamp member, the device further includes a knob having a threaded shaft. The knob is disposed on the upper surface of the upper clamp member. The threaded shaft projects freely through the upper clamp member and is threadably engaged with a female threaded hole formed in the upper surface of the lower clamp member. As the knob is turned in a clockwise direction, for example, the threaded shaft engages with the female threaded hole to pull the upper clamp member toward the lower clamp member. This arrangement advantageously allows the upper and lower clamp members to be moved toward each other in precise incremental amounts.

In the exemplary embodiment, a rear of the upper clamp member is hinged to the rear of the lower clamp member. This hinge ensures that the groove (and thus the cable to be tested) retains its position relative to the conductive piercing member. For example, the device can include a small, relatively thin, flat piece of spring steel that is attached, for example using screws, to the rear faces of the upper clamp member and the lower clamp member. This arrangement is advantageous in that the spring steel, once attached, will prevent the upper clamp member from inadvertently shifting laterally and/or longitudinally relative to the lower clamp member. Moreover, the spring steel may exert a force that naturally urges the upper clamp member away from the lower clamp member. However, it is also contemplated that instead of spring steel, the upper clamp member can be hinged to the lower clamp member using any conventional hinge arrangement without departing from the spirit and scope of the invention.

The device may further include a relatively flat metal plate upon which the upper and lower clamp members are disposed. The metal plate can include spaced-apart, upwardly projecting walls, which define a space that the lower clamp member can be disposed within. One of the walls may have the coaxial connector attached thereto. For example, an external jacket of the coaxial connector can be coupled to the wall. Further, the flat metal plate may be coupled to earth around.

To test the isolation capability of the system, the ends of the cable are first connected to respective electrical devices. As is conventional, the shield of the cable will thus be connected to earth ground via its connection to the electrical devices. Thereafter, a continuity tester may be coupled to the coaxial connector to test for continuity between the external jacket and the inner connector of the coaxial connector. As will be appreciated, since the external jacket and the inner connector of the coaxial connector are electrically isolated from each other, at this stage there will be no continuity between these features.

Next, the user places the cable over the conductive piercing member, and under and within the groove formed in the upper clamp member. Thereafter, the user may slowly turn the knob in the clockwise direction for example, to thread the threaded shaft into the female threaded hole. This will cause the conductive piercing member to pierce the outer sheathing of the cable and subsequently come into contact with the inner shield. As soon as the conductive piercing member contacts the inner shield, a closed-circuit will be formed (due to the attachment of the continuity tester) between the inner shield, which is connected to earth ground via the devices to which the cable is connected, the metal plate which is likewise connected to earth ground, the conductive piercing member which is now electrically coupled to the inner shield, and to the coaxial connector which is electrically coupled to both the conductive piercing member and the metal plate. At this point, as soon as continuity is detected, the user stops turning the knob. Thus, the conductive piercing member is prevented from piercing any of the wires contained within the cable that is to be tested.

Next, the user removes the continuity tester and attaches the coaxial connector to the signal generator using a further cable. Thereafter, the signal generator is operated to generate a test signal, which is directly injected into the shield. The devices to which the tested cable is attached are then operated in their normal manner. These devices can then be monitored for any malfunctions. This monitoring can be accomplished in any conventional manner. If no malfunctions are detected, the system immunity response is deemed to have met the requirements of the standard. The device can thus be removed, and the cable can continue to be used for its intended purpose.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, and if used and unless otherwise stated, the terms "upper", "lower", "front", "back", "over", "under", and similar such terms are not to be construed as limiting the invention to a particular orientation. Instead, these terms are used only on a relative basis.

Referring to FIGS. 1–4, a device 10 for directly injecting a test signal into a cable 20 is illustrated. The exemplary device 10 illustrated has been adapted to comply with the requirements of IEC Standard 61000-4-6, entitled *Immunity to Conducted Disturbances Induced by Radio Frequency Fields*. However, various features of the invention may be modified to comply with other, yet unknown standards, without departing from the spirit and scope of the invention.

As shown, the device 10 includes a lower clamp member 12, and an upper clamp member 14 superposed over the lower clamp member 12. Both the lower clamp member 12 and the upper clamp member 14 are preferably formed from an insulating material, such as plastic.

Figure 5:
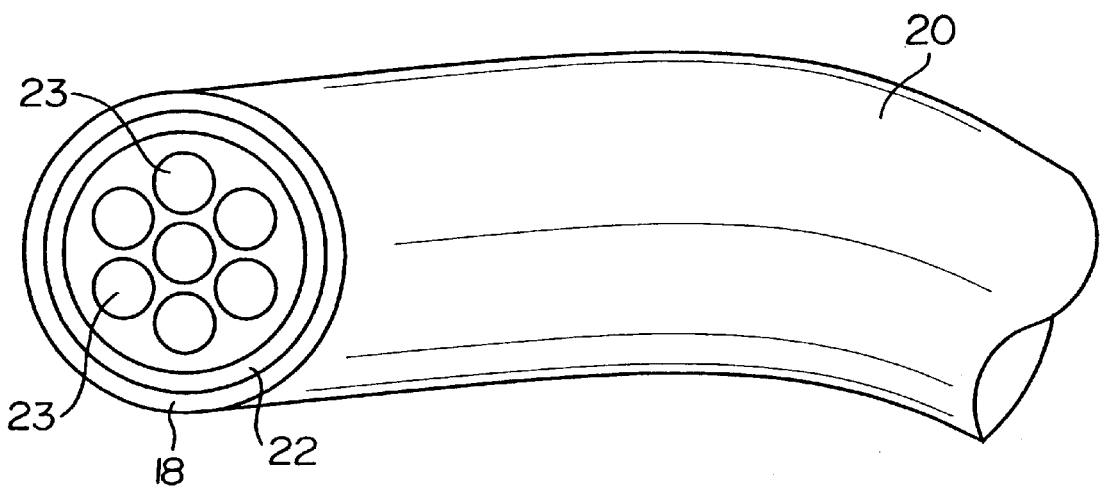
FIG. 5 is a partial sectional view of a cable to be tested by the device shown in FIG. 1.

In the exemplary illustrated embodiment, the device 10 has a conductive piercing member 16, such as a metal pin, disposed on the lower clamp member 12 to project toward the upper clamp member 14. Referring also to FIG. 5, in use, the conductive piercing member 16 will pierce an outer sheathing 18 (which is typically an insulator) of the cable 20, and engage an inner conductive shield 22 (which surrounds the signal wires 23 for example) of the cable 20, in a manner that will be subsequently described. Moreover, the conductive piercing member 16 preferably has a sharp, pointed tip that can easily pierce the outer sheathing 18 of the cable 20.

The device 10 further has a conductive coupling member 24 disposed on an upper surface of the lower clamp member 12. The conductive coupling member 24 is electrically coupled to the conductive piercing member 16. In the illustrated exemplary embodiment, the conductive coupling member 24 may be electrically coupled to a known signal generator 26 (only shown schematically in FIG. 6) that is adapted to generate a test signal to be injected into the shield 22 of the cable 20.

In the exemplary illustrated embodiment, the conductive coupling member 24 is an elongated metallic plate, which is fixed to the lower clamp member 12. For example, the conductive coupling member 24 can be screwed to the upper surface of the lower clamp member 12. Of course, the conductive coupling member 24 could be fastened to the lower clamp member 12 using other means, for example, using an adhesive, without departing from the spirit and scope of the invention.

In the exemplary illustrated embodiment, the conductive piercing member 16 is integral to the conductive coupling member 24. For example, the conductive piercing member 16 can be a pin that is welded or soldered, or otherwise permanently fastened to the conductive coupling member 24. Alternatively, the conductive piercing member 16 can be stamped from the conductive coupling member 24. With this arrangement, the conductive piercing member 16 would have an inverted V-shaped configuration to facilitate the stamping of a suitably sharp piercing member.

Figure 1:
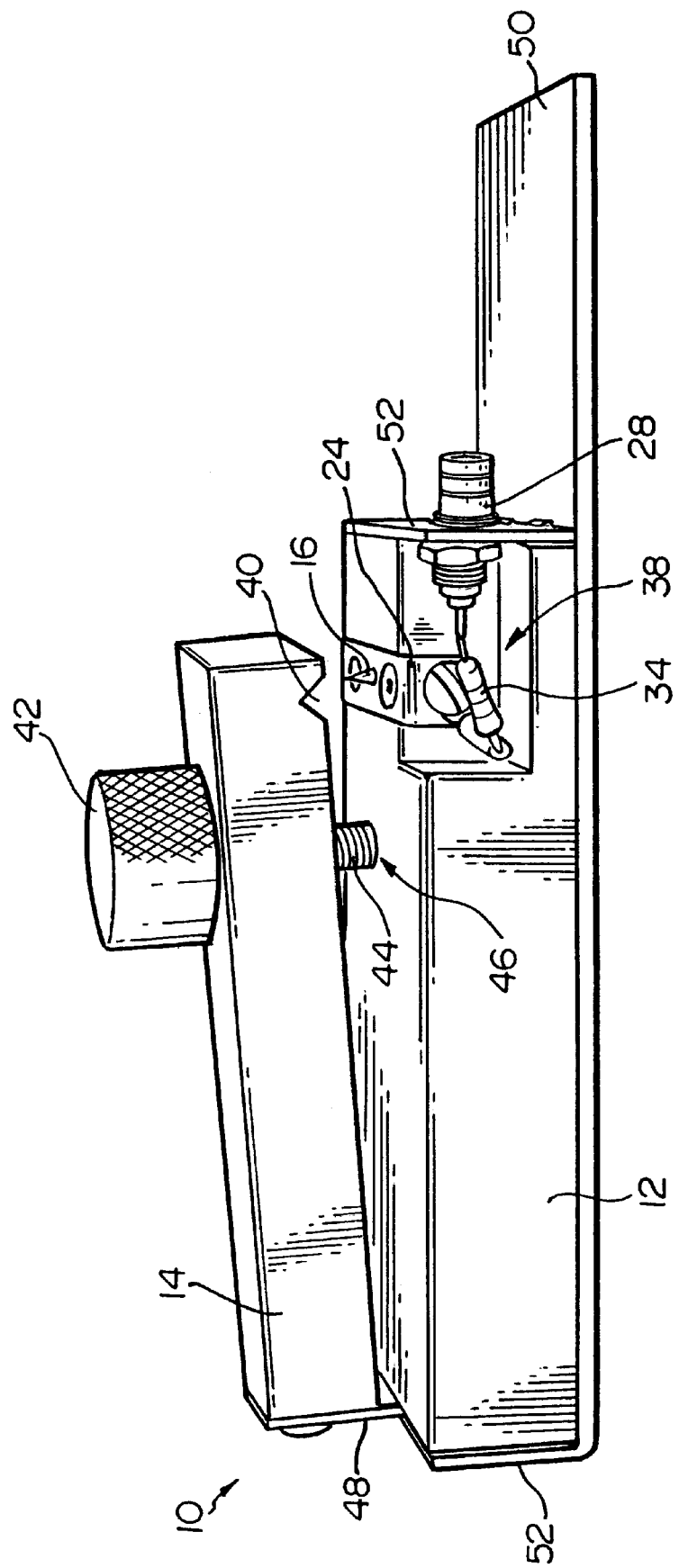
FIG. 1 is an elevational illustration of a device for injecting a test signal into a cable, according to an exemplary aspect of the invention.
Figure 2:
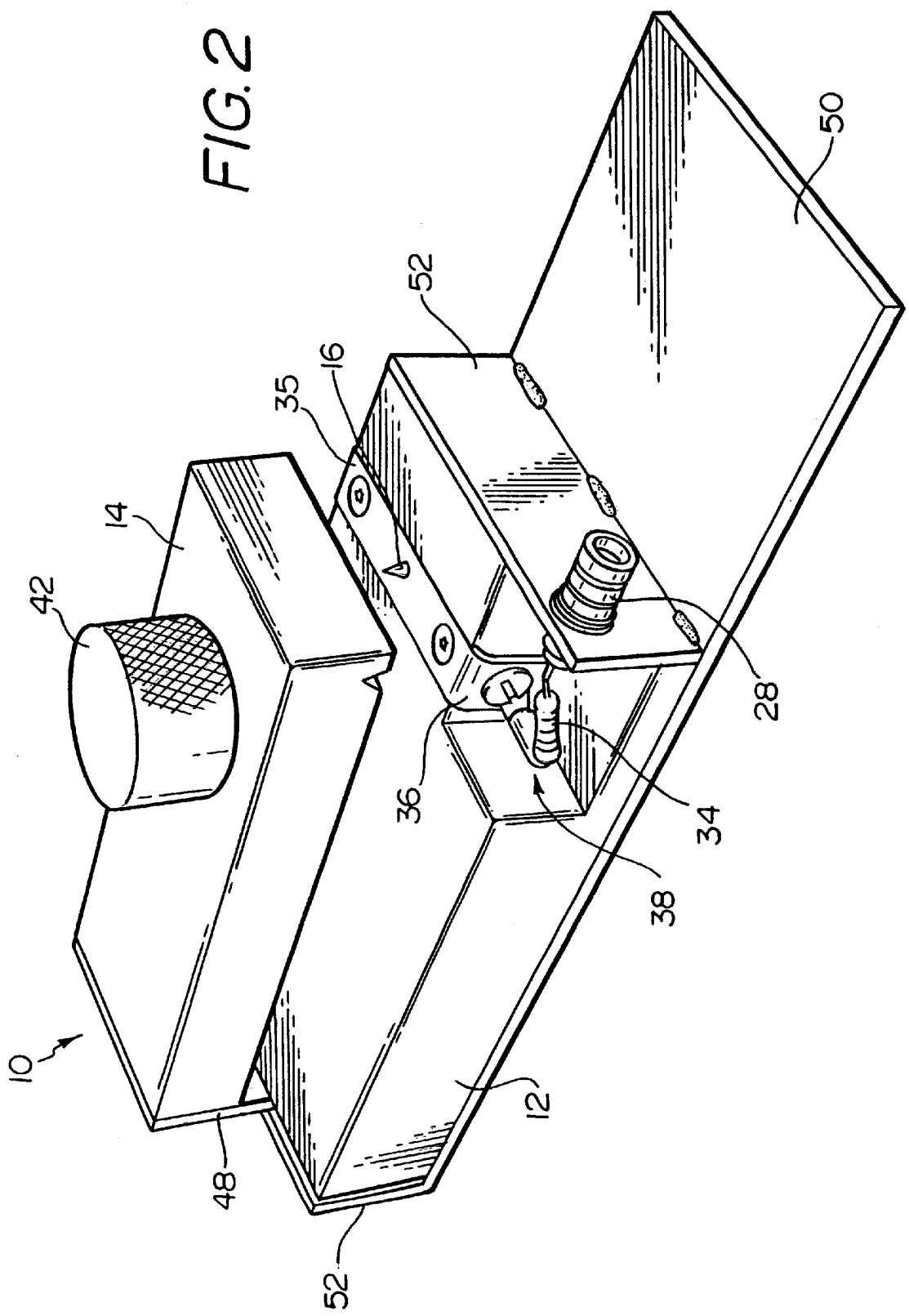
FIG. 2 is a perspective illustration of the device shown in FIG. 1.
Figure 3:
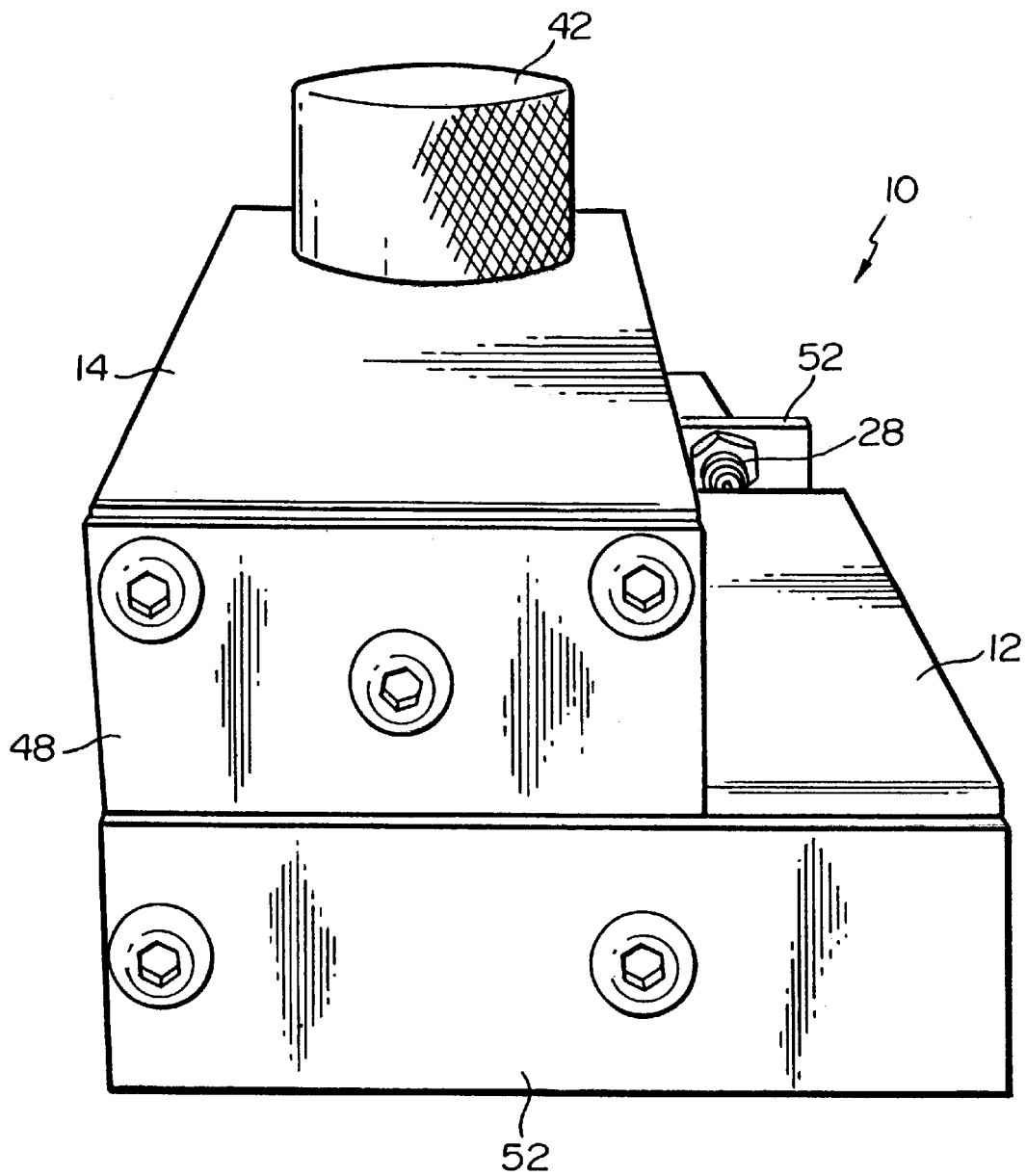
FIG. 3 is a rear view of the device shown in FIG. 1.
Figure 4:
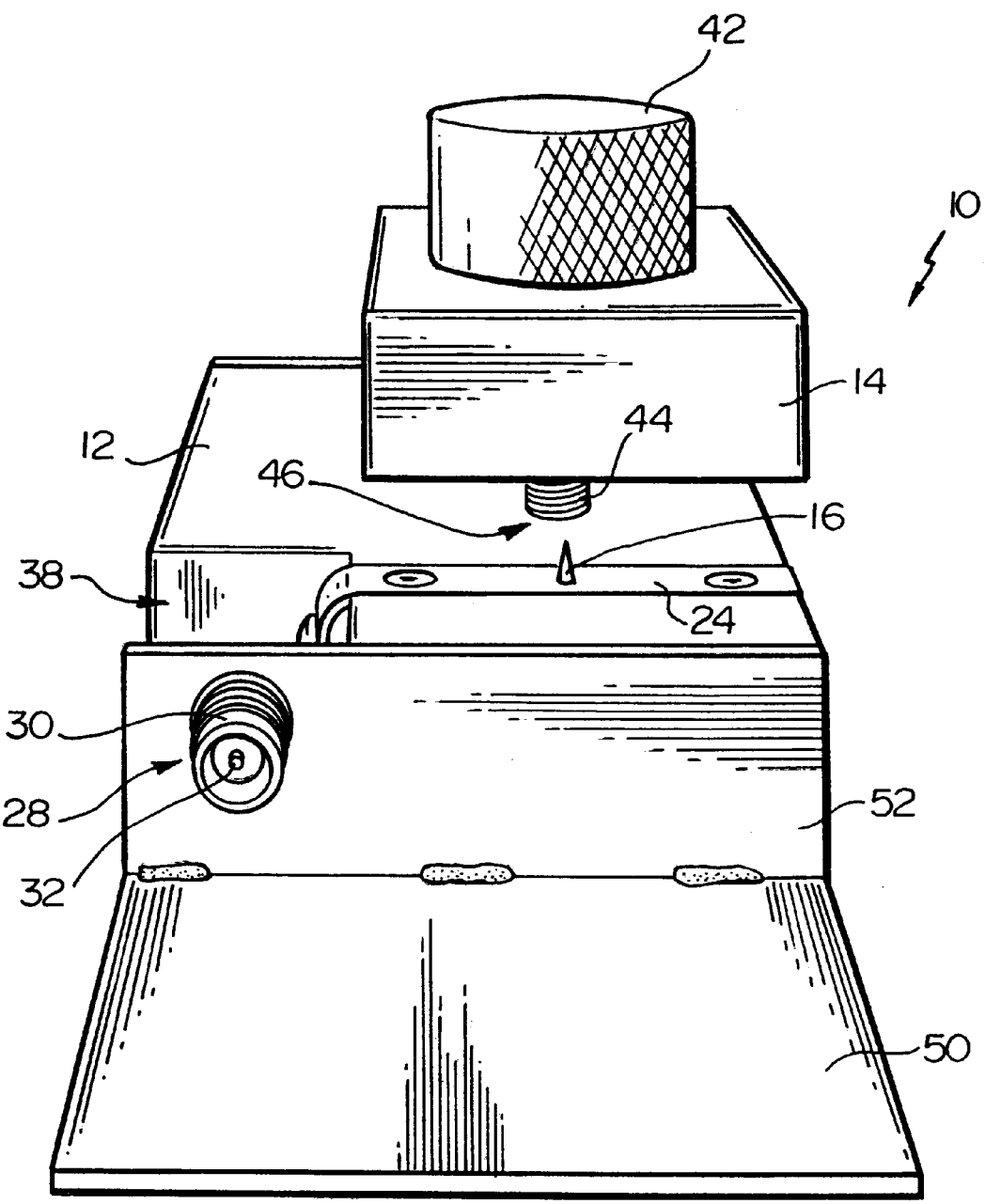
FIG. 4 is a front view of the device shown in FIG. 1.

The device 10 may further include a coaxial connector 28 that is electrically coupled to the conductive coupling member 24. The coaxial connector 28 facilitates the connection of the signal generator 26 to the device 10. For example, and as shown schematically in FIG. 6, one end of a standard coaxial cable 29 can be easily connected to the coaxial connector 28, and another end of the standard coaxial cable 29 can be connected to the signal generator 26. Such coaxial connectors 28 are well known; however, in general, and as best shown in FIG. 4, they usually include an external conductive jacket 30 that is coupled to earth ground and that can be coupled to the shield of a cable, and an inner connector 32 that can be coupled to the signal wires of the cable.

In the exemplary illustrated embodiment, the device 10 further includes a resistor 34 disposed between, and connected to the conductive coupling member 24 and the inner connector 32 of the coaxial connector 28. The resistor 34 is required by IEC Standard 61000-4-6, and in the exemplary embodiment, is a 100-ohm resistor. However, it is also contemplated that the device 10 may be used with a resistor having a different value, or with no resistor at all. Alternatively, any needed electronic component or electrical arrangement can be used in place of the resistor.

The conductive coupling member 24 may have an L-shaped configuration, with the conductive piercing member 16 being disposed on a long leg 35 of the L, and with a short leg 36 of the L projecting over a side of the lower clamp member 12. This short leg 36 can then be fastened, for example using a screw, to the resistor 34. Alternatively, the resistor 34 could be connected to the conductive coupling member 24 using other techniques, such as soldering the lead of the resistor 34 to the conductive coupling member 24.

As shown, the lower clamp member 12 may be provided with a recess 38 for accommodating the short leg 36 of the conductive coupling member 24, the end of the coaxial connector 28, and the resistor 34. The recess 38 advantageously allows these features to be somewhat protected by the lower clamp member 12, and helps to reduce the size of the device 10.

The upper clamp member 14 may be provided with a groove 40 disposed on a lower surface, and across a width, thereof. The groove 40 is arranged to be essentially parallel to the conductive coupling member 24 and positioned directly thereover. The groove 40 helps to position the cable 20 to be tested in the proper orientation relative to the conductive piercing member 16 and helps to ensure that the cable 20 will not inadvertently shift when the upper clamp member 14 and the lower clamp member 12 are clamped together.

To facilitate the clamping of the upper clamp member 14 to the lower clamp member 12, the device 10 further includes a knob 42 having a threaded shaft 44. The knob 42 is illustrated as being disposed on the upper surface of the upper clamp member 14. The threaded shaft 44 projects freely through the upper clamp member 14 and is threadably engaged with a female threaded hole 46 formed in the upper surface of the lower clamp member 12. As the knob 42 is turned in a clockwise direction, for example, the threaded shaft 44 engages with the female threaded hole 46 to pull the upper clamp member 14 toward the lower clamp member 12. This arrangement advantageously allows the upper and lower clamp members 12, 14 to be moved toward each other in precise incremental amounts.

A C-ring or pin for example (not shown), may be engaged with the threaded shaft 44 at a position that is immediately adjacent to the lower surface of the upper clamp member 14 when the knob 42 is disposed against the upper surface of the upper clamp member 14. The C-ring or pin will thus engage with the lower surface of the upper clamp member 14 when the knob 42 is turned in a counterclockwise direction for example, to raise the upper clamp member 14 away from the lower clamp member 12 as the threaded shaft 44 is threaded from the female threaded hole 46.

In the exemplary embodiment, a rear of the upper clamp member 14 is hinged to the rear of the lower clamp member 12 using a hinge 48. Hinge 48 ensures that the groove 40 (and thus the cable 20 to be tested) retains its position relative to the conductive piercing member 16. For example, the device 10 can include a small, relatively thin, flat piece of spring steel that is attached, for example using screws, to the rear faces of the upper clamp member 14 and the lower clamp member 12. This arrangement is advantageous in that the spring steel, once attached, will prevent the upper clamp member 14 from shifting laterally and/or longitudinally relative to the lower clamp member 12. Moreover, the spring steel may be configured to exert a force that naturally urges the upper clamp member 14 away from the lower clamp member 12. This would allow for the elimination of the c-ring or pin. However, it is also contemplated that instead of spring steel, the upper clamp member 14 can be hinged to the lower clamp member 12 using any conventional hinge arrangement without departing from the spirit and scope of the invention.

The device 10 may further include a relatively flat metal plate 50 upon which the upper and lower clamp members 12 are disposed. The metal plate 50 can include spaced-apart, upwardly projecting walls 52, which define a space that the lower clamp member 12 can be disposed within. One of the walls 52 may have the coaxial connector 28 attached thereto. For example, the external jacket 30 of the coaxial connector 28 can be coupled to the wall. Further, the flat metal plate 50 may be coupled to earth ground.

Figure 6:
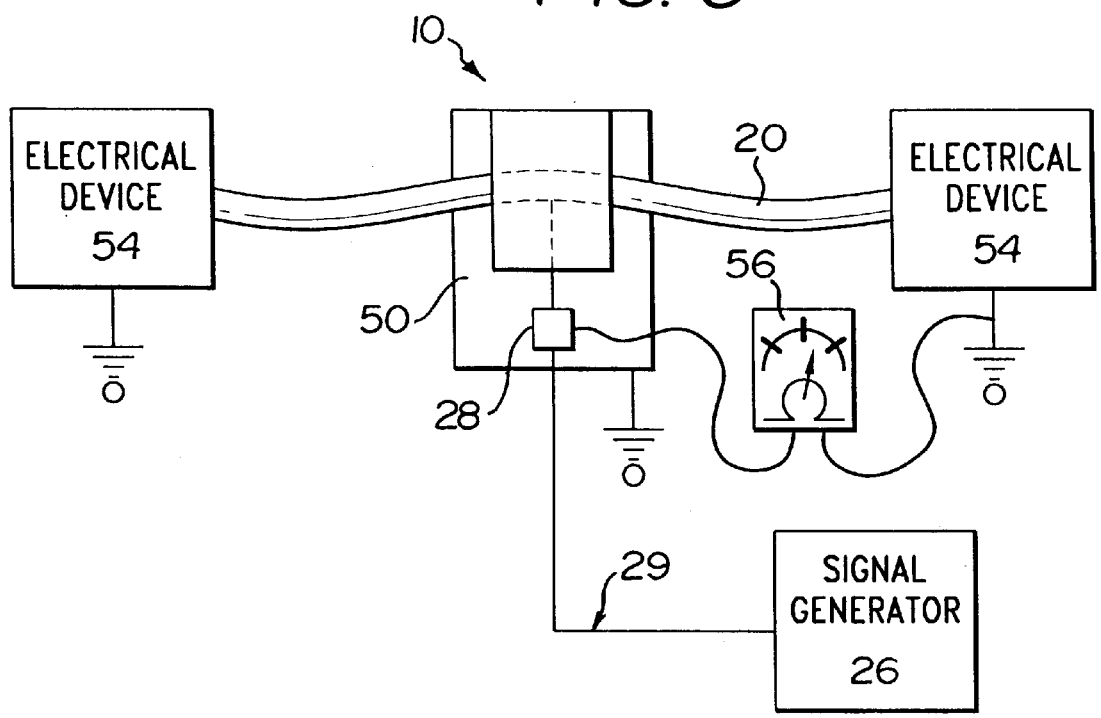
FIG. 6 is a schematic illustration of the device shown in FIG. 1, during the set up and testing of a cable.

Referring to FIG. 6, to test the system immunity response, the ends of the cable 20 are first connected to any known, respective electrical devices 54. As is conventional, the shield 22 of the cable 20 will thus be connected to earth ground via its connection to the electrical devices 54. Thereafter, a continuity tester 56 may be coupled to the coaxial connector 28 attached to the wall 52 of the metal plate 50. Such continuity testers are well known in the art. However, it may include a coaxial port (not shown) that is specifically adapted to be connected to the coaxial connector 28. This allows the leads of the continuity tester to be automatically connected to both the external jacket 30 of the coaxial connector 28, and to the inner connector 32 of the coaxial connector. Alternatively, and as shown, the continuity tester can have two wire leads, which can be separately and respectively connected to any earth ground (such as the external jacket 30) and the inner connector 28. As will be appreciated, since the external jacket 30 (and earth ground) and the inner connector 32 of the coaxial connector 28 are electrically isolated from each other, at this stage there will be no continuity between these features.

Next, the user places the cable 20 over the conductive piercing member 16, and under and within the groove 40 formed in the upper clamp member 14. Thereafter, the user may slowly turn the knob 42 in the clockwise direction for example, to thread the threaded shaft 44 into the female threaded hole 46. This will cause the conductive piercing member 16 to pierce the outer sheathing 18 of the cable 20 and subsequently come into contact with the inner shield 22. As soon as the conductive piercing member 16 contacts the inner shield 22, the inner connector 32 of the coaxial connector 28 will be coupled to earth ground via its connection to the inner shield 22, which is itself connected to earth ground via the electrical devices 54 to which the cable 20 is connected. The continuity tester will thus detect continuity between the earth ground and the inner connector 32 of the coaxial connector 28. At this point, as soon as continuity is detected, the user stops turning the knob 42. Thus, the conductive piercing member 16 is prevented from piercing any of the wires contained within the cable 20 that is to be tested.

Next, the user may remove the continuity tester 56 and attach the signal generator 26 to the coaxial connector 28 using the standard coaxial cable 29. Thereafter, the signal generator 26 is operated to generate a test signal, which is directly injected into the shield 22. The electrical devices 54 to which the tested cable 20 is attached are then operated in their normal manner. These electrical devices 54 can then be monitored for any malfunctions. This monitoring can be accomplished in any conventional manner. If no malfunctions are detected, the system's immunity response is deemed to have met the requirements of the standard. The device 10 can thus be removed, and the cable 20 can continue to be used for its intended purpose.

Although in the described embodiment, the groove 40 was presented as being formed in the upper clamp member 14, and the conductive coupling member 24 and conductive piercing member 16 were presented as being disposed on the lower clamp member 12, it is contemplated that these features can be reversed. For example, the groove could be formed on the upper surface of the lower clamp member, and the conductive coupling member and the conductive piercing member could be disposed on the lower surface of the upper clamp member.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A device for piercing a cable, comprising:
   a first clamp member having front and rear ends;
   a second clamp member having front and rear ends, said first clamp member and said second clamp member being superposed relative to each other;
   a hinge that connects the rear end of said first clamp member to the rear end of said second clamp member;
   a conductive piercing member disposed on said first clamp member, and in a region of the front end of said first clamp member; and means for moving said first clamp member and said second clamp member together, said means being disposed between said conductive piercing member and said hinge, wherein as said first clamp member and said second clamp member are moved together, a distance between said conductive piercing member and said second clamp member is reduced.

2. The device recited in claim 1, wherein said first clamp member is disposed under said second clamp member, and wherein said conductive piercing member is disposed on an upper surface of said first clamp member.

3. The device recited in claim 2, wherein said second clamp member has a groove formed therein and on a lower surface thereof, the groove being disposed over said conductive piercing member.

4. The device recited in claim 1, wherein said second clamp member has a groove formed therein, said conductive piercing member projecting toward the groove.

5. The device recited in claim 4, wherein the groove extends across a width of said second clamp member.

6. The device recited in claim 1, wherein said hinge is disposed on a rear face of said first clamp member and a rear face of said second clamp member.

7. The device recited in claim 6, wherein said hinge is a spring steel plate attached to the rear face of said first clamp member and the rear face of said second clamp member.

8. The device recited in claim 1, further comprising a conductive coupling member disposed on said first clamp member, said conductive piercing member being integral with said conductive coupling member.

9. The device recited in claim 8, wherein said second clamp member has a groove formed therein, said conductive piercing member projecting toward the groove, wherein the groove extends across a width of said second clamp member, wherein said conductive coupling member extends across a width of said first clamp member, and wherein said conductive coupling member and the groove are parallel to each other and arranged to face each other.

10. The device recited in claim 1, wherein said first clamp member and said second clamp member are both formed from an insulating material.

11. The device recited in claim 1, wherein said means includes a shaft that is threadably engaged with one of said clamp members, and that passes freely through another one of said clamp members, wherein when said shaft is turned, said first clamp member and said second clamp member are moved together.

12. The device recited in claim 11, wherein said shaft has one end that is threadably engaged with said first clamp member, and has another end that projects through said second clamp member, and wherein said means further includes a knob attached to the another end of said shaft.

13. The device recited in claim 1, further comprising a metal plate; and a cable connector attached to said metal plate, said cable connector having an external jacket conductively coupled to said metal plate, and an inner connector conductively coupled to said conductive piercing member.

14. The device recited in claim 13, wherein said cable connector comprises a coaxial connector.

15. The device recited in claim 13, wherein said first clamp member is attached to said metal plate.

16. A device for piercing a cable, comprising:
a first clamp member;
a second clamp member, said first clamp member and said second clamp member being superposed relative to each other;
a conductive piercing member disposed on said first clamp member; and
means for moving said first clamp member and said second clamp member together, wherein as said first clamp member and said second clamp member are moved together, a distance between said conductive piercing member and said second clamp member is reduced,
wherein said first clamp member has a recess formed therein, further comprising an L-shaped conductive coupling member disposed on said first clamp member, said conductive piercing member being attached to a long leg of said L-shaped conductive coupling member, said L-shaped conductive coupling member further having a short leg that projects into the recess.

17. A testing arrangement, comprising:
a device for piercing a cable, including:
a first clamp member having a recess formed therein, said first clamp
member being formed from an insulating material;
a second clamp member disposed over said first clamp member, and having a groove formed therein and on a lower surface thereof, the groove extending across a width of said second clamp member, said second clamp member being formed from an insulating material, said first clamp member and said second clamp member being superposed relative to each other;
a conductive piercing member disposed on an upper surface of said first clamp member and being located under the groove;
an L-shaped conductive coupling member disposed on said first clamp member, said conductive piercing member being integral with a long leg of said L-shaped conductive coupling member, said conductive coupling member extending across a width of said first clamp member, said conductive coupling member and the groove being parallel to each other and arranged to face each other, said L-shaped conductive coupling member further having a short leg that projects into the recess;
a hinge that connects said first clamp member to said second clamp member, said hinge being disposed on a rear face of said first clamp member and a rear face of said second clamp member, said hinge being a spring steel plate attached to the rear face of said first clamp member and the rear face of said second clamp member;
means for moving said first clamp member and said second clamp member together, so that as said first clamp member and said second clamp member are moved together by said means, a distance between said conductive piercing member and said second clamp member is reduced; and
a cable connector conductively coupled to the short leg of said conductive coupling member;
a signal generator that generates a test signal; and
a cable for transmitting the test signal to the conductive piercing member, and having one end coupled to said signal generator, and another end coupled to said cable connector.

18. A method of testing immunity characteristics of a system, comprising:
providing a cable having at least one signal wire and a conductive shield that surrounds the signal wire;
electrically coupling two electrical devices together using the signal wire of the cable, and attaching the conductive shield to an earth ground;

providing a piercing device for piercing the cable; activating the piercing device until the cable is pierced by the piercing device and the shield of the cable is conductively coupled to the piercing device;

attaching a signal generator to the piercing device and activating the signal generator to generate a signal;

injecting the signal directly into the shield of the cable via the piercing device;

operating the two electrical devices; and monitoring an operation of the two electrical devices while injecting the signal directly into the shield of the cable via the piercing device;

wherein if the two electrical devices operate properly during said monitoring, the shield will be deemed as providing satisfactory immunity against interference, and the cable may be used for its intended purpose, and wherein if either of the two electrical devices malfunction during said monitoring, the shield will be deemed as providing unsatisfactory immunity against interference.

19. The method recited in claim 18, further comprising coupling a continuity tester to the piercing device prior to said activating the piercing device; and activating the piercing device only until continuity is indicated by the continuity tester.

20. The method recited in claim 19, wherein the piercing device includes;

a first clamp member formed from an insulating material;

a second clamp member disposed over the first clamp member, and having a groove formed therein and on a lower surface thereof, the groove extending across a width of the second clamp member, the second clamp member being formed from an insulating material, the first clamp member and the second clamp member being superposed relative to each other;

a conductive piercing member disposed on an upper surface of the first clamp member and being located under the groove;

a conductive coupling member disposed on the first clamp member, the conductive piercing member being integral with the conductive coupling member, the conductive coupling member extending across a width of the first clamp member, the conductive coupling member and the groove being parallel to each other and arranged to face each other;

a knob having a shaft connected thereto, the shaft extending freely through the second clamp member, and having an end threadably engaged with the first clamp member; and a cable connector conductively coupled to the conductive coupling member.

21. The method recited in claim 20, wherein said activating includes turning the knob to thread the shaft to the first clamp member and move the first clamp member and the second clamp member together, so that as the first clamp member and the second clamp member are moved together, the conductive piercing member pierces the cable.

22. The method recited in claim 20, wherein said coupling a continuity tester to the device includes coupling the continuity tester to the cable connector.

23. The method recited in claim 18, wherein the piercing device includes:

a first clamp member having front and rear ends;

a second clamp member having front and rear ends, said first clamp member and said second clamp member being superposed relative to each other;

a hinge that connects the rear end of said first clamp member to the rear end of said second clamp member;

a conductive piercing member disposed on said first clamp member, and in a region of the front end of said first clamp member; and means for moving said first clamp member and said second clamp member together, said means being disposed between said conductive piercing member and said hinge, wherein as said first clamp member and said second clamp member are moved together, a distance between said conductive piercing member and said second clamp member is reduced.

24. The method recited in claim 18, wherein the piercing device includes:

a first clamp member having a recess formed therein;

a second clamp member, said first clamp member and said second clamp member being superposed relative to each other;

a conductive piercing member disposed on said first clamp member;

means for moving said first clamp member and said second clamp member together, wherein as said first clamp member and said second clamp member are moved together, a distance between said conductive piercing member and said second clamp member is reduced; and an L-shaped conductive coupling member disposed on said first clamp member, said conductive piercing member being attached to a long leg of said L-shaped conductive coupling member, said L-shaped conductive coupling member further having a short leg that projects into the recess.

* * * * *